(12) United States Patent
Tatematsu et al.

(10) Patent No.: US 7,256,591 B2
(45) Date of Patent: Aug. 14, 2007

(54) PROBE CARD, HAVING CANTILEVER-TYPE PROBE AND METHOD

(75) Inventors: Tsutomu Tatematsu, Kuwana (JP);
Kenji Togashi, Kawasaki (JP);
Tetsuhiro Nanbu, Kawasaki (JP);
Shigenobu Ishihara, Kawasaki (JP);
Morihiko Hamada, Kawasaki (JP);
Yoshikazu Arisaka, Kawasaki (JP);
Kunihiro Itagaki, Kawasaki (JP);
Shigekazu Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/284,085

(22) Filed: Oct. 31, 2002

(65) Prior Publication Data

US 2003/0098701 A1 May 29, 2003

Related U.S. Application Data

(63) Continuation-in-part of application No. 10/108,338, filed on Mar. 29, 2002, now abandoned.

(30) Foreign Application Priority Data

Nov. 29, 2001 (JP) .............................. 2001-364108
May 14, 2002 (JP) .............................. 2002-138078

(51) Int. Cl.
*G01R 31/02* (2006.01)

(52) U.S. Cl. ...................................... 324/754; 324/762

(58) Field of Classification Search ............... 324/72.5, 324/754, 758, 761–762, 765, 158.1; 439/169, 439/174, 482, 912, 66, 197
See application file for complete search history.

(56) References Cited

U.S. PATENT DOCUMENTS 4,965,865 A * 10/1990 Trenary ....................... 324/754
5,066,907 A * 11/1991 Tarzwell et al. ............. 324/758
5,177,438 A * 1/1993 Littlebury et al. .......... 324/754
5,315,237 A   5/1994 Iwakura et al.
5,742,174 A * 4/1998 Kister et al. ................. 324/762

(Continued)

FOREIGN PATENT DOCUMENTS

JP            63-71536           5/1988

(Continued)

OTHER PUBLICATIONS

Office Action dated Jul. 25, 2006 in prosecution of corresponding Japanese patent application.

(Continued)

*Primary Examiner*—Minh N. Tang
(74) *Attorney, Agent, or Firm*—Staas and Halsey LLP (57) ABSTRACT

A probe card is used to test an electronic device. The probe card includes a base plate and a cantilever-type probe arranged on the base plate. The cantilever-type probe has an end that contacts the contacted body and moves when contacting the contacted body. A stopper arranged on the base plate restricts the movement of the cantilever-type probe.

17 Claims, 7 Drawing Sheets

U.S. PATENT DOCUMENTS

| | | | |
|---|---|---|---|
| 6,255,126 B1 * | 7/2001 | Mathieu et al. | 438/15 |
| 6,468,098 B1 * | 10/2002 | Eldridge | 439/197 |
| 6,713,374 B2 * | 3/2004 | Eldridge et al. | 438/611 |
| 6,811,406 B2 * | 11/2004 | Grube | 439/66 |

FOREIGN PATENT DOCUMENTS

| | | |
|---|---|---|
| JP | 5-41421 | 2/1993 |
| JP | 6-204304 | 7/1994 |
| JP | 7-78853 | 3/1995 |
| JP | 09-89931 | 4/1997 |
| JP | 09-119961 | 5/1997 |
| JP | 10-227811 | 8/1998 |
| JP | 11-142437 | 5/1999 |
| JP | 2000-55936 | 2/2000 |
| JP | 2000-111574 | 4/2000 |
| JP | 2000-327402 | 11/2000 |
| JP | 2001-108708 | 4/2001 |

OTHER PUBLICATIONS

Japanese Office Action dated Jun. 5, 2007 for related Japanese patent application.

* cited by examiner

PROBE CARD, HAVING CANTILEVER-TYPE PROBE AND METHOD

CROSS-REFERENCED TO RELATED APPLICATIONS

This application is a continuation in part of application Ser. No. 10/108,338, filed Mar. 29, 2002, now abandoned. This application is based upon and claims the benefit of priority from the prior Japanese Patent Application Nos. 2001-364108, filed Nov. 29, 2001, and 2002-138078, filed May 14, 2002, the entire contents of which are incorporated herein by reference.

BACKGROUND OF THE INVENTION

The present invention relates to a probe card for testing a semiconductor device and a semiconductor substrate.

When manufacturing a semiconductor device, a probing test is normally conducted to test the conductivity of a wafer. In the probing test, a plurality of probes respectively contact a plurality of pads, which are formed on the wafer. Various properties of the semiconductor device are measured in accordance with probing test programs. The enlargement of recent semiconductor circuits has increased the number of pads. However, the area of each pad has decreased. To shorten the time required for the probing test, it is important that the contact between the probes and the pads be guaranteed.

A probe card, which has a plurality of probes, is used during the probing test. A probing device causes the probes to contact the pads of a wafer with a predetermined contact pressure. More specifically, referring to FIG. 1A, the probing device causes each probe pin 3 to approach a corresponding pad 2, which is formed on a wafer substrate 1. Then, the probing device lifts the wafer substrate 1 by distance A and presses the pad 2 against the probe pin 3.

Figure 2:
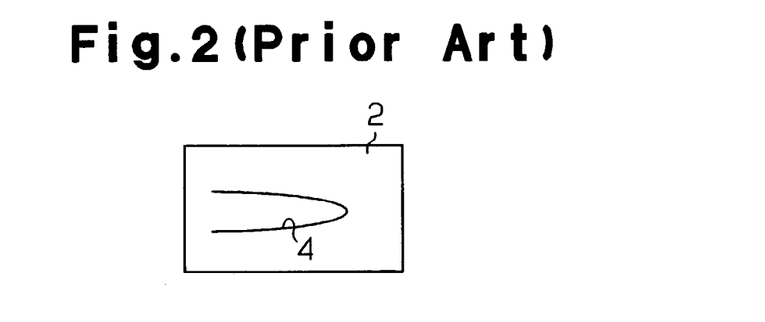
FIG. 2 is a plan view showing a pit formed in the pad by the probe of FIGS. 1A and 1B.

In the prior art, the distance A must be great enough to guarantee that each probe pin 3 contacts the pad 2. However, as the wafer substrate 1 rises, the distal end of the probe pin 3 bites into the pad 2 and moves in the direction indicated by arrow B. This removes the surface of the pad 2 and forms a pit 4 (FIG. 2). If the distance A is too large, the pit 4 becomes relatively long (large), and a relatively large amount of material, which is removed from the pad 2, is adhered to the distal end of the probe pin 3.

The recent pads are thin. Thus, the distal ends of the probe pins 3 may reach the underlying layers of the pads 2. In such case, metal material, such as aluminum (Al), gold (Au), and nickel (Ni), may adhere to the distal ends of the probe pins 3. When the probing device tests a plurality of electronic devices, the probe pins 3 are repetitively pressed against the corresponding pads 2 of the electronic devices. This deposits the materials of the pads 2 and the underlying layers on the distal ends of the probe pins 3. The deposition of the materials causes contact failure between the probe pins 3 and the pads 2 and decreases the reliability of the probing test.

Due to the higher integration and increased functions of recent electronic devices, many complicated tests must be conducted during the probing test. Thus, the probe pins 3 repetitively contact the same pads 2. In such case, the probe pins 3 repetitively remove material from the corresponding pads 2 and enlarge the pits 4. This results in bonding deficiencies between bonding wires and the pads 2 during a subsequent bonding process.

An increase in the number of pads has increased the number of probes. Thus, a probe card nowadays has 600 to 800 and in some cases more than 1,000 probes that are arranged with a narrow interval between one another. To arrange a large number of probes on a probe card, the inclination angle α between the pads 2 and the corresponding probe pins 3 is relatively small. As a result, it is difficult for the probe pins 3 to contact the pads with sufficient pressure.

Japanese Laid-Open Patent Publication No. 11-142437 describes a probe card provided with a guide plate having a guide hole to guide a probe pin. Although the probe card increases the positioning accuracy of the probe pin, it is difficult to optimally adjust the contact pressure between the probe pin and the pad. Further, the guide hole must be machined with high accuracy. This increases the manufacturing cost of the probing device.

Japanese Laid-Open Patent Publication No. 2000-327402 describes the material of a guide that guides a probe. The material enables fine machining of the guide and improves the accuracy of the contact position between the probe and the pad. However, since the guide is made of a special material, the cost of the probing device increases.

Japanese Laid-Open Patent Publication No. 2001-108708 describes a probe card having a guide that decreases the moving amount of the probe relative to the pad. However, the guide requires high machining accuracy. This increases the manufacturing cost of the probe card. Further, it is difficult to have the probe, which becomes thinner at positions closer to the distal end, contact the pad with sufficient contact pressure.

SUMMARY OF THE INVENTION

It is an object of the present invention to provide an inexpensive probing card that has a probe contact a pad with high reliability. It is another object of the present invention to provide a semiconductor device testing apparatus having the probing card.

To achieve the above object, the present invention provides a probe card used to test an electronic device having a contacted body. The probe card includes a base plate and a probe arranged on the base plate. The probe has a distal end that contacts the contacted body and moves in a predetermined direction when contacting the contacted body. A stopper is arranged on the base plate to restrict the movement of the probe.

A further perspective of the present invention is a method for having a probe contact a contacted body. The probe extends from a peripheral portion of a base plate toward a middle portion of the base plate. The method includes moving the probe toward the middle portion of the base plate while the probe contacts the contacted body, and restricting the movement of the probe with a stopper.

A further perspective of the present invention is a method for having a probe contact a contacted body. The probe has a basal end fixed to a peripheral portion of a base plate, an intermediate portion extending toward a middle portion of the base plate, and a distal end bent toward the peripheral portion of the base plate. The method includes moving the probe toward the peripheral portion of the base plate while the probe contacts the contacted body, and restricting the movement of the probe with a stopper.

A further perspective of the present invention is a probe card used to test an electronic device having a contacted body. The probe card includes a base plate and a plurality of probes arranged on the base plate. Each of the probes has a distal end that contacts the contacted body and moves in a predetermined direction when contacting the contacted body. A stopper is arranged on the base plate for restricting the movement of the probe. The stopper has a side surface separated from the probes by a predetermined distance.

A further perspective of the present invention is a method for manufacturing a probe card that is used to test an electronic device having a contacted body. The method includes preparing a probe and a base plate having an opening, and inserting a stopper in the opening so that a side surface of the stopper is separated from a distal end of the probe by a predetermined distance.

A further perspective of the present invention is a method for manufacturing a probe card that is used to test an electronic device having a contacted body. The method includes preparing a probe and a base plate having a support. The probe has a basal end fixed to a peripheral portion of a base plate, an intermediate portion extending toward a middle portion of the base plate, and a distal end bent toward the peripheral portion of the base plate. The support supports the intermediate portion of the probe. The method further includes attaching a stopper to the support. The stopper has a side surface located near the distal end of the probe.

A further perspective of the present invention is an apparatus for testing a wafer substrate having a plurality of pads. The apparatus includes a probing device including a probe card, which has a base plate, a plurality of probe pins arranged on the base plate, and a stopper arranged on the base plate for restricting the movement of the plurality of probe pins. The probing device causes the plurality of probe pins to contact the plurality of pads, and each of the probe pins has a distal end moving in a predetermined direction when contacting the plurality of pads. A controlling unit generates a test signal to conduct a conductivity test of the wafer substrate and supplying the test signal to the plurality of probe pins.

A further perspective of the present invention is an apparatus for testing a wafer substrate having at least one pad. The apparatus includes a probe card having a base plate, a plurality of probe pins including a signal pin and arranged on the base plate, a stopper arranged on the base plate for restricting the movement of the plurality of probe pins, and an electrode arranged at a position in the stopper where the electrode can contact the signal pin. A probing device has a stage arranged below the probe card where the wafer substrate is mounted thereon. A stage driver vertically moves the stage so as to bring the wafer substrate into contact with the plurality of probe pins. A controlling unit controls the probing device in order to conduct a conductivity test for the wafer substrate. The controlling unit supplies a test signal for use in the conductivity test to the signal pin, applies a predetermined voltage to the electrode, and moves the stage. The controlling unit determines the contact between the plurality of probe pins and the stopper at the time when the signal pin is short-circuited with the electrode and the potential of the signal pin is changed, and the controlling unit determines an overdrive amount of the stage based on the position of the stage at the time when the signal pin is short-circuited with the electrode.

A further perspective of the present invention is a method for using an apparatus for testing a wafer substrate having at least one pad. The method includes the steps of moving a stage on which the wafer substrate is mounted so as to bring the pad into contact with a probe pin; detecting whether the probe pin contacts the stopper; and adjusting an amount of the movement of the stage based on the position of the stage at the time when the probe pin contacts the stopper.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A probe card 100 according to a first embodiment of the present invention will now be discussed with reference to FIGS. 3 to 6. Referring to FIG. 4, the probe card 100 includes a base plate 11, a plurality of probe pins 13 attached to the base plate 11, and a stopper 14 secured to the base plate 11. The base plate 11 is made of an electrically insulative material. An opening 12 extends through the center of the base plate 11 to receive the stopper 14.

Figure 6:
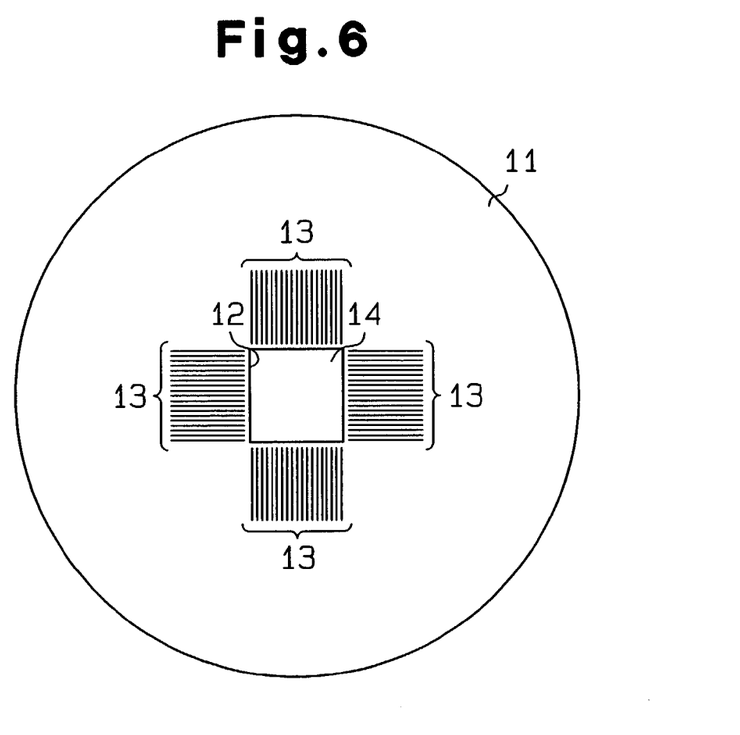
FIG. 6 is a bottom view showing the probe card of FIG. 3.

Referring to FIG. 6, a plurality of probe pins 13 are arranged on the lower surface of the base plate 11 so as to surround the opening 12. The probe pins 13 are preferably made of a material such as tungsten or BeCu. The basal ends of the probe pins 13 are supported by the base plate 11 along the sides of the opening 12.

A plurality of wires (not shown) surrounding the opening 12 are connected to the probe pins 13 and to lands (not shown) formed along the peripheral portion of the base plate 11. Accordingly, the probe pins 13 are connected to a probing device by the wires and the lands.

Figure 3:
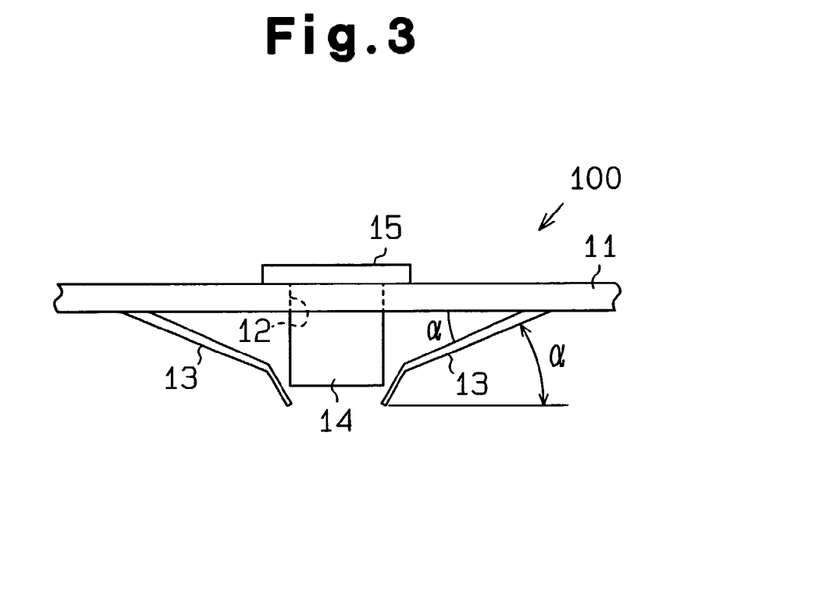
FIG. 3 is a side view showing a probe card according to a first embodiment of the present invention.
Figure 4:
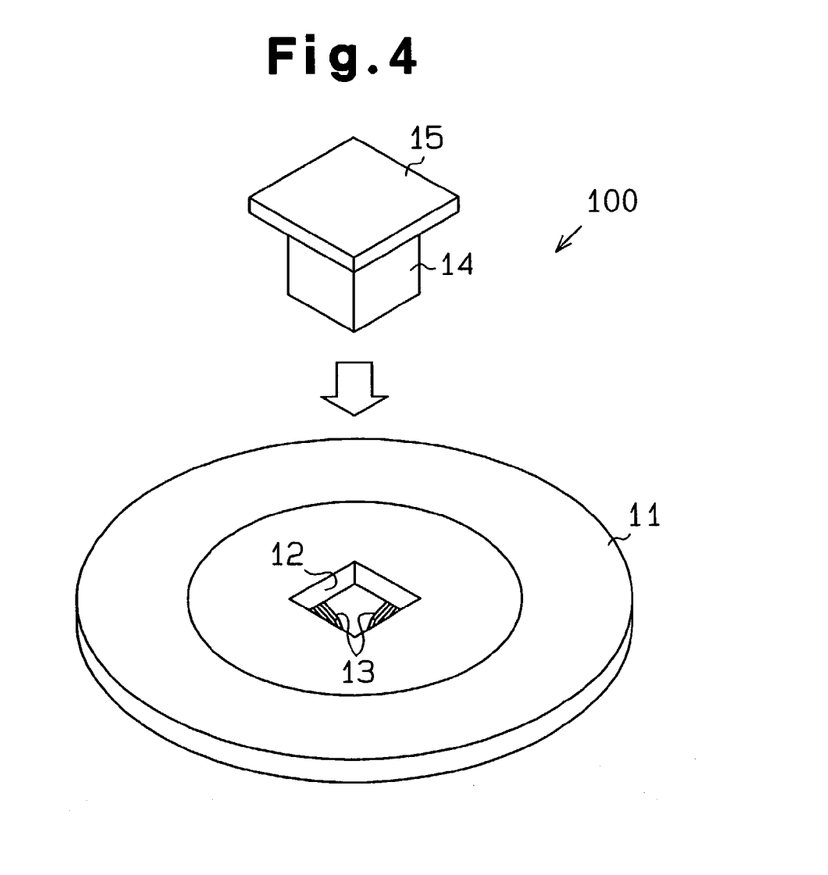
FIG. 4 is an exploded perspective view showing the probe card of FIG. 3.
Figure 5:
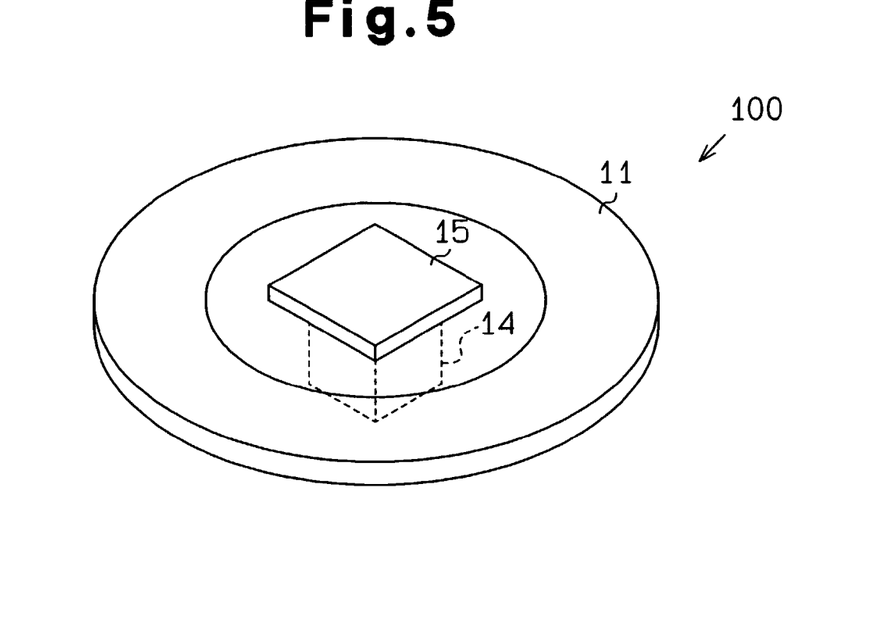
FIG. 5 is a perspective view showing the probe card of FIG. 3.

Referring to FIG. 3, each of the probe pins 13 extend diagonally downward toward the opening 12 at a predetermined inclination angle α. Each probe pin 13 has a distal end, which is bent downward. The angle formed between the distal end of the probe pin 13 and a pad is greater than the inclination angle α.

An engaging piece 15, which is arranged on the top of the stopper 14, is larger than the opening 12. The engaging piece 15 is made of an electrically insulative material, such as alumina ceramic.

The stopper 14 is inserted in the opening 12 and the engaging piece 15 is fixed to the base plate 11 to secure the stopper 14 to the base plate 11. The probe card 100 is assembled in this manner. In this state, referring to FIG. 6, the distal ends of the probe pins 13 surround the stopper 14. It is preferred that the stopper 14 be separated from the distal ends of the probe pins 13 by 5 to 15 μm. Further, the distal ends of the probe pins 13 are located at a level that is lower than the bottom end of the stopper 14.

Figure 9:
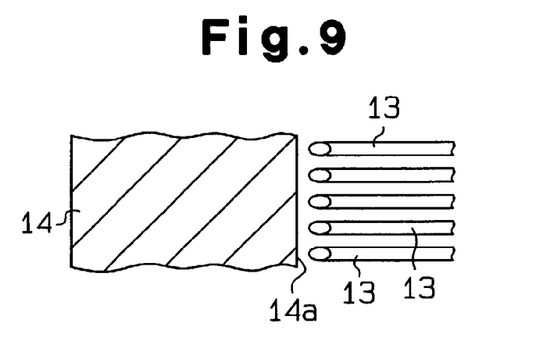
FIGS. 9 and 10 are bottom views showing a stopper and the distal ends of probes.

To attach as many probe pins 13 as possible to the base plate 11, the area of which is limited, the basal ends of the probe pins 13 are supported by the base plate 11 in a stepped manner. Further, the distal end of the probe pins 13 located on one side of the stopper 14 may be arranged along the same line, as shown in FIG. 9. Alternatively, the distal end of the probe pins 13 may be arranged so that they extend in an alternate manner, as shown in FIG. 10.

Referring to FIG. 9, when the distal ends of the probe pins 13 are arranged along the same line, it is preferred that the stopper 14 have a flat side surface 14a.

Figure 10:
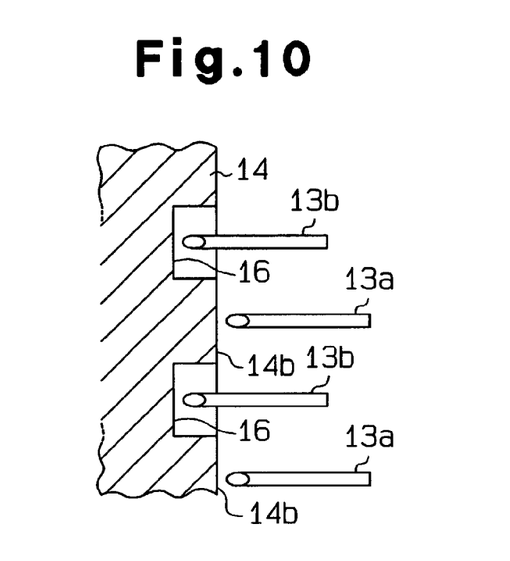

Referring to FIG. 10, when the probe card 100 has probe pins 13a, 13b, which extend alternately toward the middle portion of the base plate 11, slots 16 are formed in the stopper 14 so that an equal distance is always maintained between the probe pins 13a, 13b and the stopper 14. More specifically, the probe card 100 of FIG. 10 has the probe pins 13a, the distal ends of which are arranged along a first line, and the probe pins 13b, the distal ends of which are arranged along a second line. The sides of the stopper 14 each include an outer surface 14b, which opposes the probe pins 13b, and the slots 16, which oppose the probe pins 13b. The slots 16 are formed so that the distance between the slots 16 and the corresponding probe pins 13b is equal to the distance between the outer surfaces 14b and the corresponding probe pins 13a.

The operation of the probe card 100 will now be discussed.

Figure 7A:
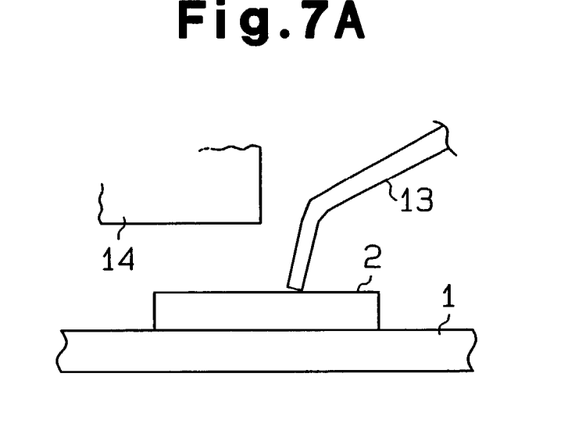
FIGS. 7A and 7B are side views showing a probe and a pad.
Figure 7B:
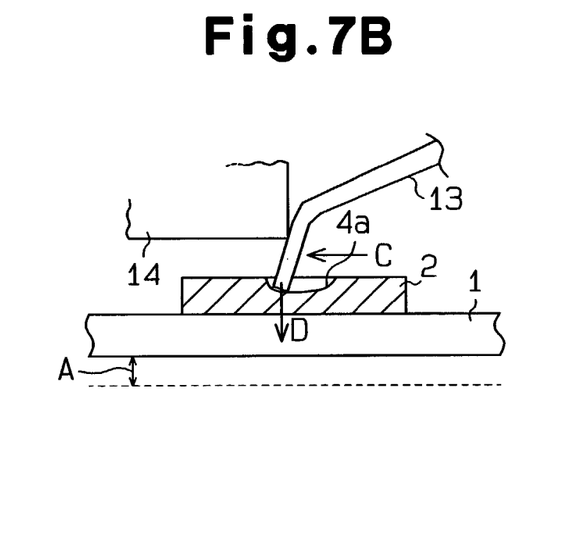

To conduct a probing test, referring to FIG. 7A, the distal ends of the probe pins 13 are moved toward corresponding pads (contacted bodies) 2 on a wafer substrate 1. Referring to FIG. 7B, the probing device then lifts the wafer substrate 1 by a predetermined distance A. This presses the distal ends of the probe pins 13 against the pads 2.

Figure 8:
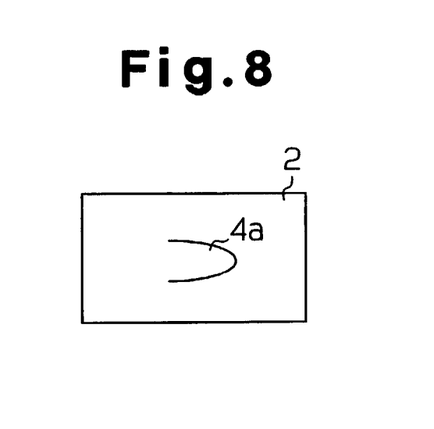
FIG. 8 is a plan view showing a pit formed in a pad by the probe card of FIG. 3.

As the wafer substrate 1 rises, the distal ends of the probe pins 13 bite into the corresponding pads 2 and moves toward the stopper 14, as indicated by arrow C. This removes part of the surface of the pad 2 and forms a pit 4a, as shown in FIG. 8. However, the probe pins 13 come into contact with the stopper 14. This restricts further movement of the probe pins 13. After the probe pins 13 contact the stopper 14, the contact pressure D between the probe pins 13 and the pads 2 increases. Accordingly, sufficient contact pressure D is obtained.

The probe card 100 of the first embodiment has the advantages described below.

When the wafer substrate 1 is lifted and the pads 2 contact the probe pins 13, the stopper 14 restricts the sliding of the probe pins 13. This improves the accuracy of the contact position between each probe pin 13 and the corresponding pad 2.

The stopper 14 restricts the sliding of the probe pin 13. Thus, when the wafer substrate 1 is lifted, the probe pins 13 contacts the pads 2 with sufficient contact pressure D. Accordingly, the angle between the pads 2 and the probe pins 13 (i.e., inclination angle α) does not have to be increased.

The stopper 14 decreases the moving distance of the probe pins 13. Thus, the amount of material removed by the probe pins 13 is decreased. This reduces the amount of material that adheres to the probe pins 13. As a result, connection failures between the probe pins 13 and the pads 2 decrease.

The stopper 14 decreases the sliding distance of the probe pins 13. Thus, the pits 4a formed in the surface of the pads 2 are relatively short (small). This prevents bonding deficiencies from occurring between bonding wires and the pads 2 during a bonding process.

The distance between the distal ends of the probe pins 13 and the stopper 14 need only be set at about 5–15 μm and thus does not require high accuracy. Accordingly, the employment of the stopper 14 only slightly increases the manufacturing cost of the probe card 100.

Figure 11:
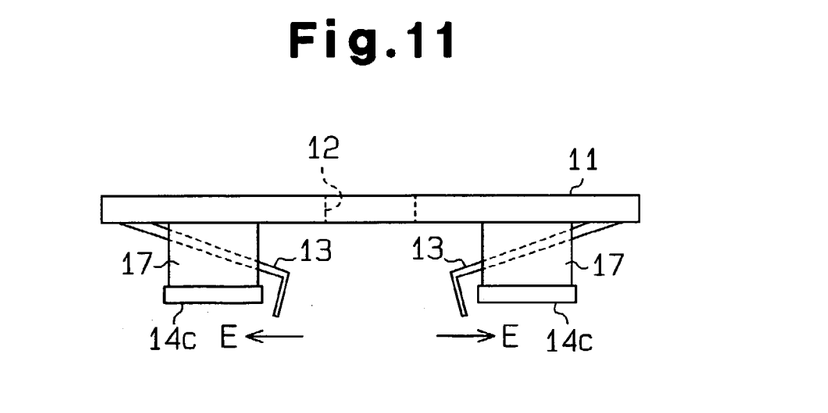
FIG. 11 is a side view showing a probe card according to a second embodiment of the present invention.

A probe card 200 according to a second embodiment of the present invention will now be discussed with reference to FIG. 11. The probe card 200 includes a plurality of probe pins 13 extending from the peripheral portion of the base plate 11 toward the middle portion of the base plate 11, a support 17 fixed to the base plate 11, and a stopper 14c supported by the support 17.

Each of the probe pins 13 has an intermediate portion, which extends through the support 17, and a distal end, which is bent outward of the base plate 11. The stopper 14c is attached to (supported by) the lower end of the support 17. The stopper 14c is arranged outward of the base plate 11 relative to the distal ends of the probe pins 13. In other words, the distal ends of the probe pins 13 are surrounded by the stopper 14c.

When conducting the probing test, the wafer substrate 1 is lifted so that the probe pins 13 contact the corresponding pads 2. As the wafer substrate 1 rises, the distal ends of the probe pins 13 bite into the pads 2 and move outward of the probe card 20 as indicated by arrows E in FIG. 11. When the probe pins 13 contact the stopper 14c, further movement of the probe pins 13 is restricted.

The movement of the probe pins 13 slightly removes material from the surface of the corresponding pads 2. After the probe pins 13 contacts the stopper 14c, the rising of the wafer substrate 1 increases the contact pressure D between the probe pin 13 and the pad 2. Accordingly, sufficient contact pressure D is obtained.

In addition to the advantages of the first embodiment, the probe card 200 of the second embodiment has the following advantage.

When conducting a heating test while the probe pins 13 contact the pads 2, the probe pins 13 and the support 17 thermally expand. The thermal expansion may displace the distal ends of the probe pins 13. However, the stopper 14c restricts the displacement of the probe pins 13. Accordingly, the contact position and contact pressure of each probe pin 13 is stably maintained even when conducting the heating test.

Next, a semiconductor device testing apparatus 300 according to a third embodiment of the present invention will be described.

Figure 12:
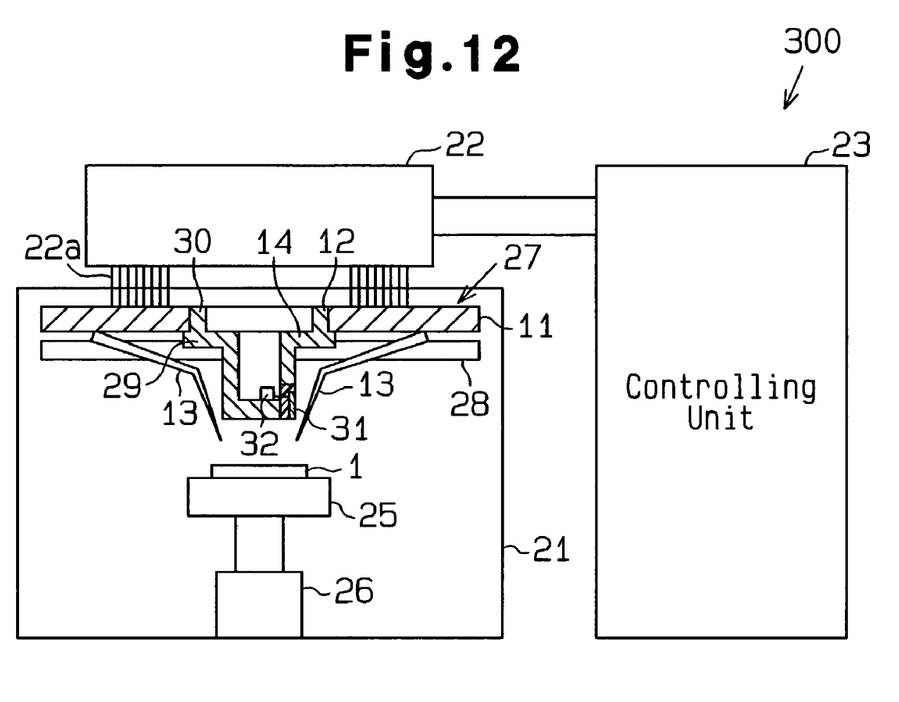
FIG. 12 is a schematic view showing a semiconductor device testing apparatus according to a third embodiment of the present invention.

As shown in FIG. 12, the semiconductor device testing apparatus 300 is provided with a probing device 21, a test head 22, and a controlling unit 23.

A wafer substrate 1 is placed on a stage 25 arranged in the probing device 21. The stage 25 is vertically moved by a stage driver 26 having a motor. A probe card 27 is installed in the upper part of the probing device 21.

The probe card 27 includes a base plate 11, a probe pin 13, and a stopper 14. The base plate 11 has a square opening 12. A plurality of connection pads (not shown) are formed around the opening 12. The plurality of pads are brought into contact with a plurality of connection pins 22a extending from the test head 22, and the probe card 27 is connected to the controlling unit 23 via the test head 22.

On an undersurface of the base plate 11, a plurality of probe pins 13 are arranged so as to surround the opening 12. Basal ends of the plurality of probe pins 13 are supported by a fixture part 28, and are respectively connected to a plurality of wires (not shown) formed in the base plate 11. The probe pins 13 diagonally extend to the center of the opening 12. Each of the distal ends of the probe pins 13 is bent downward in order to increase the approach angle of the wafer substrate 1 to the pad 2.

The stopper 14 is fixed to the base plate 11. The stopper 14 is a square tube having a bottom end. In the upper part of the stopper 14, a brim 29 contacting the undersurface of the base plate 11 and an engaging part 30 protruding above the stopper 14 and engaged in the opening 12 are provided.

When the stage 25 is lifted up, the distal end of the probe pin 13 contacts the pad 2 on the wafer substrate 1. With the further lift of the stage 25 to the upward, the distal end of the probe pin 13 breaks into the pad 2 while sliding toward the center of the base plate 11. When the probe pin 13 comes into contact with the stopper 14, further slide of the probe pin 13 is restricted (refer to FIG. 7B).

Figure 13:
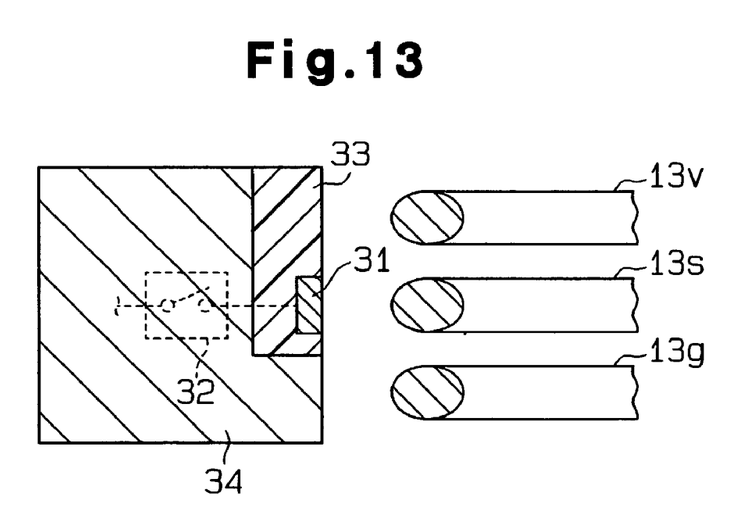
FIG. 13 is a sectional view of a stopper arranged in the testing apparatus of FIG. 12.

As shown in FIG. 13, in a bottom end of the stopper 14, a conductive electrode 31 is arranged at a position where the probe pin 13 contacts. The conductive electrode 31 is connected to a relay 32, which selectively applies a predetermined voltage to the conductive electrode 31.

As shown in FIG. 13, the probe pins 13 include at least one ground pin 13g, at least one signal pin 13s, and at least one power-supply pin 13v. The conductive electrode 31 is formed at a portion which the signal pin 13s contacts in the bottom end of the stopper 14. An insulating portion 33 made of insulative material such as a synthetic resin is formed at the portion which the power-supply pin 13v contacts and around the conductive electrode 31. On the other hand, no insulating portion 33 is formed at a portion which the ground pin 13g contacts. The stopper 14 is made of a conductive material. The ground pin 13g directly contacts the bottom end of the stopper 14 without interposing the insulating portion 33 therebetween. The bottom end of the stopper 14 functions as a planar ground electrode 34. The ground electrode 34 enhances the ground in the probe card 27.

Figure 14:
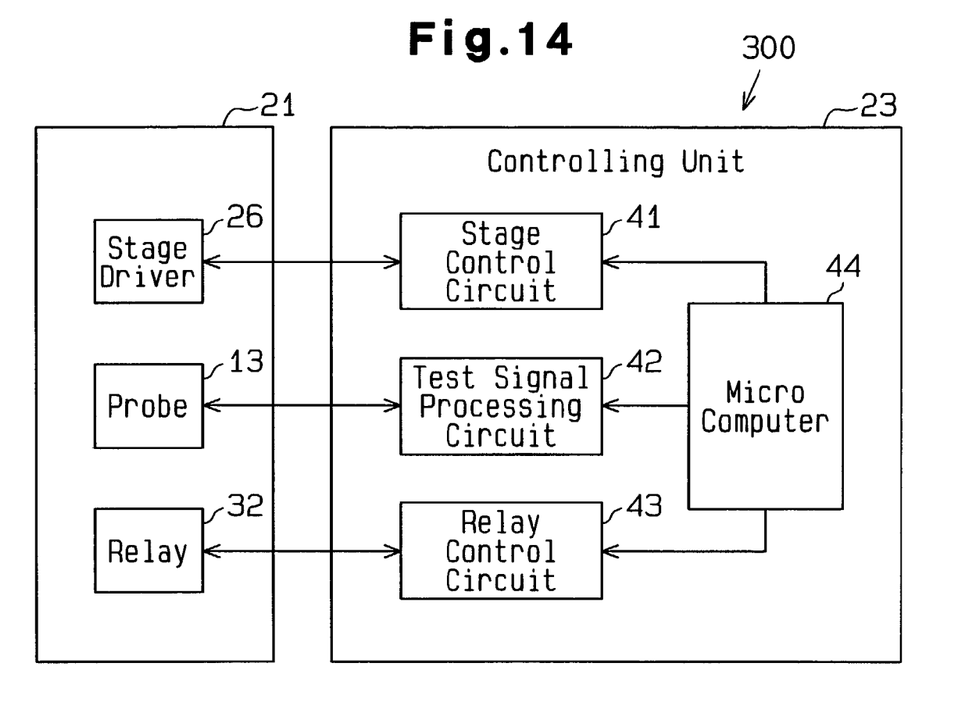
FIG. 14 is a block diagram of the semiconductor device testing apparatus of FIG. 12.

As shown in FIG. 14, the controlling unit 23 is provided with a stage control circuit 41, a test signal processing circuit 42, a relay control circuit 43, and a microcomputer 44. Each of the circuits 41 to 42 is connected to the microcomputer 44.

The microcomputer 44 has a storage device (not shown), and a CPU (not shown) to execute the processing program stored in the storage device. The microcomputer 44 controls the semiconductor device testing apparatus 300 by operating the circuits 41 to 43 in accordance with the processing program.

The stage control circuit 41 generates a driving signal to move the stage 25 and supplies the driving signal to the stage driver 26. The stage driver 26 moves the stage 25 in accordance with the driving signal. The stage control circuit 41 receives a displacement signal indicating the amount of the movement of the stage 25 from the stage driver 26, and constantly monitors the position of the stage 25 based on the displacement signal. When the stage 25 is moved to a predetermined position, the stage control circuit 41 stops the supply of the driving signal to the stage driver 26. The positional information of the stage 25 is sequentially input to the microcomputer 44 from the stage control circuit 41.

The test signal processing circuit 42 generates a test signal for use in the conductivity test of the wafer substrate 1. The test signal is supplied to a predetermined probe pin 13, and then input to the pad 2 of the wafer substrate 1 from the probe pin 13. The signal in response to the test signal is returned to another probe pin 13 from the wafer substrate 1. The test signal processing circuit 42 determines whether or not the returned signal is a normal signal that corresponds to the test signal, and then supplies the result of the determination to the microcomputer 44.

The relay control circuit 43 supplies a predetermined voltage and a driving signal to drive a relay 32 to the relay 32. The relay 32 is turned on in response to the driving signal, and when the relay 32 is turned on, a predetermined voltage is applied to the conductive electrode 31.

The detection of the contact between the stopper 14 and the probe pin 13 will be described. In the case of detecting the contact between the stopper 14 and the probe pin 13, high potential voltage (e.g., 5V) is applied to the conductive electrode 31 via the relay 32, and on the other hand, low potential voltage (e.g., 0V) is applied to the signal pin 13s. When the probe pin 13 contacts the stopper 14, more specifically, when the signal pin 13s is short-circuited with the conductive electrode 31, the potential of the signal pin 13s changes. The test signal processing circuit 42 detects the change (abnormality) in the potential of the signal pin 13s, and notifies the microcomputer 44 of the occurrence of the abnormality. On the reception of the notification, the microcomputer 44 determines that the probe pin 13 electrically contacts the stopper 14.

It is also possible to determine the electrical contact between the stopper 14 and the probe pin 13, while applying the low potential voltage (0V) to the conductive electrode 31 and high potential voltage (5V) to the signal pin 13s, respectively.

Next, the operation of the semiconductor device testing apparatus 300 will be described.

First, the microcomputer 44 controls the stage control circuit 41 to output the driving signal, thereby driving the stage driver 26. By so doing, the stage 25 moves upward and the distal end of the probe pin 13 contacts the pad 2 on the wafer substrate 1 (refer to FIG. 7A). At this time, the distal end of the probe pin 13 and the pad 2 are photographed by a camera (not shown). The image taken by the camera is supplied to the microcomputer 44. The microcomputer 44 determines the contact of the probe pin 13 to the pad 2 based on the image. The microcomputer 44 obtains the positional information of the stage 25 at the time when the probe pin 13 contacts the pad 2 from the stage control circuit 41. The position is set as a reference position in which the overdrive amount is "0".

Next, the microcomputer 44 controls the relay control circuit 43 to output the driving signal, thereby turning on the relay 32. By so doing, the high potential voltage is applied to the conductive electrode 31 of the stopper 14 via the relay 32. The microcomputer 44 controls the test signal processing circuit 42 to output the test signal, thereby setting the voltage of the signal pin 13s to the low potential (e.g., 0V).

Furthermore, the microcomputer 44 controls the stage control circuit 41 to supply the driving signal to the stage driver 26, thereby moving the stage 25 to the upward. With the movement of the stage 25, the distal end of the probe pin 13 is pressed to the pad 2, and slides toward the stopper 14 (toward the center of the base plate 11). When the probe pin 13 contacts the stopper 14, the signal pin 13s is short-circuited with the conductive electrode 31.

By this short circuit, the potential of the conductive electrode 31 is decreased. The test signal processing circuit 42 notifies the microcomputer 44 of the potential decrease (abnormality) of the signal pin 13s. The microcomputer 44 detects the contact between the stopper 14 and the probe pin 13 based on the notification of the potential decrease. In addition, the microcomputer 44 obtains the positional information of the stage 25 at this time from the stage control circuit 41. The microcomputer 44 calculates the overdrive amount at the time when the probe pin 13 contacts the stopper 14 based on the positional information.

The microcomputer 44 calculates the optimum overdrive amount for maintaining the accurate stylus force based on the calculated overdrive amount. In this case, the optimum overdrive amount is determined in consideration of not only the stylus force of the probe pin 13 but also the stress applied to the contact portion P1 between the probe pin 13 and the stopper 14.

The microcomputer 44 inputs the optimum overdrive amount to the stage control circuit 41. The stage control circuit 41 outputs the driving signal so as to move the stage 25 as much as the optimum overdrive amount. Therefore, the stylus force of the probe pin 13 is maintained optimally. Thereafter, the relay control circuit 43 turns off the relay 32, whereby the supply of the high potential voltage to the conductive electrode 31 in the stopper 14 is stopped. The test signal processing circuit 42 outputs the test signal to each of the probe pins 13, and then, the conductivity test for measuring the various characteristics of the wafer substrate 1 is carried out.

Usually, a plurality of IC chip circuits are formed on the wafer substrate 1. The conductivity test is carried out to each of the IC chip circuits, and the repetition of the conductivity test makes it possible to examine the plurality of IC chip circuits on the wafer substrate 1. It is not necessary to perform the controlling process of the overdrive amount by the relay control at every conductivity test. More specifically, it is sufficient to perform the controlling process of the overdrive amount only once at the time before the initial conductivity test for the wafer substrate 1. In this case, since the number of controlling processes of the overdrive amount is reduced, the increase in the test time can be prevented.

Figure 1A:
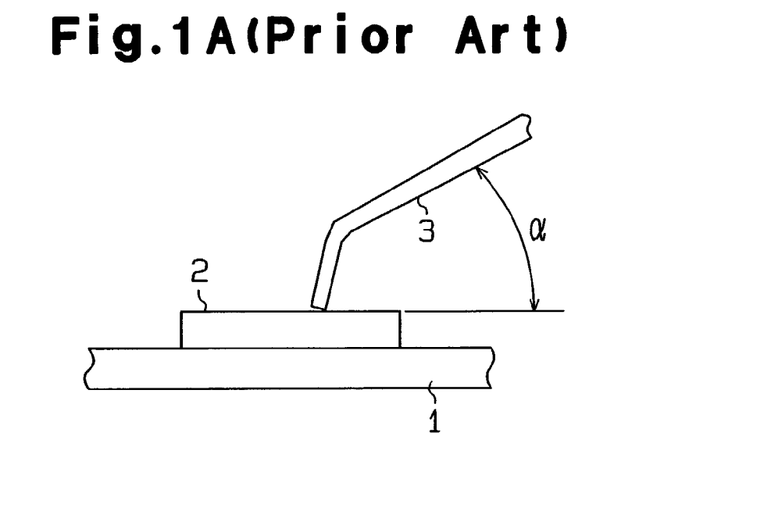
FIGS. 1A and 1B are side views showing a prior art probe in a state contacting a pad.
Figure 1B:
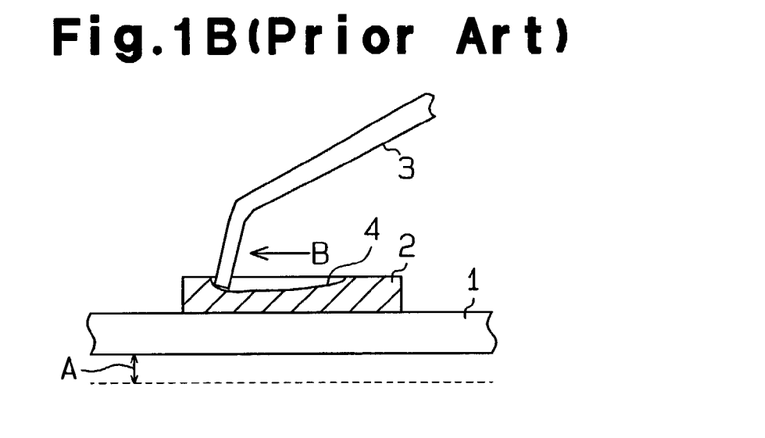

In the case where the conventional probe card having no stopper 14 is used, the distal end of the probe 3 is first brought into contact with the pad 2 as shown in FIG. 1A. The stylus force of the probe 3 is appropriately controlled by controlling the lifting distance (overdrive amount) A of the wafer substrate 1 as shown in FIG. 1B. More specifically, the distal end of the prove 3 and the pad 2 are photographed by a camera, and the positions of the distal end of the probe 3 and the pad 2 are recognized based on the photographed image data. Then, the position at which the distal end of the probe 3 contacts the pad 2 (reference position, or the position where the overdrive amount is 0) is calculated in accordance with the result of the recognition, and the distance (overdrive amount) A by which the wafer substrate 1 is lifted from the reference position is determined based on the size of a pit 4 formed on the pad 2 (the amount of removal of the pad 2 by the probe 3).

In the third embodiment, the stylus force of the probe pin 13 is increased by providing the stopper 14 to the probe card. However, if the overdrive amount A increases more than necessary and an excessively large stylus force is applied, since the slide of the probe pin 13 is restricted by the stopper 14, the size of the pit by the probe pin 13 formed in the pad 2 remains the same. Therefore, it becomes impossible to set the appropriate overdrive amount corresponding to the stylus force by means of the image recognition. When an excessively large stylus force is applied in the probe card, the stress applied to the contact portion P1 between the probe pin 13 and the stopper 14 increases as shown in FIG. 7B. Accordingly, the probe pin 13 is deteriorated and as a result, the lifetime of the prove pin 13 is disadvantageously shortened.

Note that Japanese Laid-Open Patent Publication No. Hei 9-119961 discloses a technique in which a position on the wafer substrate where the pad contacts the distal ends of the probe is obtained and the overdrive amount is automatically controlled. In this technique, however, it is impossible to set the appropriate overdrive amount in the probe card having the stopper 14.

Contrary to this, in the third embodiment, it is possible to perform the controlling process of the overdrive amount for the prevention of the application of an excessively large stylus force in the semiconductor device testing apparatus 300, which uses a probe card provided with the stopper 14.

According to the semiconductor device testing apparatus 300 in the third embodiment, the advantages as follows can be achieved in addition to those in the first embodiment.

(1) Since the contact between the probe pin 13 and the stopper 14 is detected and the optimum overdrive amount is calculated based on the detection result, the application of excessively large stress to the contact portion P1 between the probe pin 13 and the stopper 14 can be avoided, and the lifetime of the probe pin 13 can be increased.

(2) Since the planar ground electrode 34 is formed in the bottom end of the stopper 14, the enhancement of the ground in the probe card 27 can be achieved. In addition, by the enhancement of the ground, the noise resistance of the probe card 27 can be improved, and as a result, the reliability of the test can be improved.

It should be apparent to those skilled in the art that the present invention may be embodied in many other specific forms without departing from the spirit or scope of the invention. Particularly, it should be understood that the present invention may be embodied in the following forms.

The shape of the stopper 14 in the first to third embodiments can be changed in accordance with the layout of the plurality of pads 2 and probe pins 13. For example, the stopper 14 does not have to be a square elongated structure and may be a cylindrical structure or another type of elongated polygonal structure.

In the third embodiment, it is also possible to determine the contact between the probe pin 13 and the stopper 14 by short-circuiting the ground pin 13g or the power-supply pin 13v. For example, in the case where the contact between the probe pin 13 and the stopper 14 is determined by the ground pin 13g, a predetermined voltage is applied to the planar ground electrode 34 in the bottom end of the stopper 14 via the relay 32. Also, an insulating portion is formed at a position in the stopper 14 which the signal pin 13s and the power-supply pin 13v of the probe pins 13 contact, thereby preventing the contact of the signal pin 13s and the power-supply pin 13v to the ground electrode 34 of the stopper 14. In such a manner, it is also possible to detect the contact between the probe pin 13 and the stopper 14, and thus, the optimum overdrive amount can be calculated.

In the case where the semiconductor device testing apparatus 300 is configured with the stopper 14 shown in the first and second embodiments as a component thereof, the stopper 14 is not provided with the conductive electrode 31 and the relay 32. Therefore, it is possible to eliminate the relay control circuit 43 in the controlling unit 23. In this case, a driving signal is output from the stage control circuit 41 to the stage driver 26 based on the predetermined overdrive amount, and the movement of the stage 25 is stopped at a fixed position.

In the third embodiment, it is also possible to determine the contact between the probe pin 13 and the stopper 14 by the detection of the current passing through the relay 32 when the conductive electrode 31 of the stopper 14 is short-circuited with the signal pin 13s.

The present examples and embodiments are to be considered as illustrative and not restrictive, and the invention is not to be limited to the details given herein, but may be modified within the scope and equivalence of the appended claims.

What is claimed is:

1. A probe card used to test an electronic device having contacted bodies, the probe card comprising:
   a base plate;
   a plurality of cantilever-type probes each having only a basal end of the probe attached to the base plate, wherein each of the cantilever-type probes has an inclined distal end that contacts respective one of the contacted bodies and an inclined intermediate portion extending between the basal end and the distal end and being inclined with respect to the base plate and not attached to the base plate, each of the inclined distal ends is inclined with respect to both of the basal end and the intermediate portion and slides in a direction along a surface of the respective contacted body when contacting the respective contacted body; and
   a slide stopper arranged on the base plate restricting the slide of the inclined distal ends of the cantilever-type probes when contacting sides of the inclined distal ends.

2. The probe card according to claim 1, wherein each of the cantilever-type probes has the basal end fixed to a peripheral portion of the base plate, and the inclined distal end of each of the cantilever-type probes extends toward a middle portion of the base plate, wherein the inclined distal ends of the cantilever-type probes slide toward the middle portion of the base plate when contacting the contacted bodies.

3. The probe card according to claim 2, wherein the stopper is arranged in the middle portion of the base plate.

4. The probe card according to claim 2, wherein the stopper is received in an opening extending through the middle portion of the base plate and has a side surface adjacent to the inclined distal ends of the cantilever-type probe.

5. The probe card according to claim 1, wherein
   the probe has a basal end fixed to a peripheral portion of the base plate and an intermediate portion extending toward a middle portion of the base plate;
   the stopper is arranged between the distal end of the probe and the peripheral portion of the base substrate; and
   the distal end of the probe bends outward toward the peripheral portion of the base plate from the intermediate portion and moves toward the middle portion of the base plate when contacting the contacted body.

6. The probe card according to claim 5, further comprising a support for attaching the stopper to the base plate.

7. The probe card according to claim 6, wherein the support supports the intermediate portion of the probe, and the stopper is attached to a lower end of the support.

8. The probe card according to claim 1, wherein the stopper has a side surface separated from the distal end of the probe by a predetermined distance.

9. The probe card according to claim 8, wherein the probe is one of a plurality of probes which are arranged so that their distal ends are along the same line, and the side surface of the stopper is flat.

10. The probe card according to claim 8, wherein the probe is one of a plurality of probes which are arranged so that their distal ends are along different lines, and the side surface of the stopper has a plurality of slots so that the distance between the side surface and the distal ends of all of the probes is equal.

11. The probe card according to claim 8, wherein the probe is one of a plurality of probes that include first probes, which are arranged so that their distal ends are arranged along a first line, and second probes, which are arranged so that their distal ends are arranged along a second line, and wherein the side surface of the stopper includes a surface opposed to the first probes and slots opposed to the second probe.

12. The probe card according to claim 1, wherein the probe has the basal end fixed to a peripheral portion of the base plate.

13. A method for having a plurality of cantilever-type probes contact contacted bodies, wherein each of the cantilever-type probes extends from a peripheral portion of a base plate toward a middle portion of the base plate and includes a basal end attached to the base plate, and an inclined distal end that contacts a respective one of the contacted bodies, and an inclined intermediate portion being inclined with respect to the base plate and not attached to the base plate, the inclined distal end being inclined with respect to both of the basal end and the intermediate portion, the method comprising:
   sliding each of the inclined distal ends of the cantilever-type probes toward the middle portion of the base plate in a direction along a surface of the respective contacted body while the inclined distal end contacts the respective contacted body; and
   restricting the slide of the cantilever-type probes by contacting sides of the inclined distal ends of the probes to a slide stopper.

14. A probe card used to test an electronic device having contacted bodies, the probe card comprising:
   a base plate;
   a plurality of cantilever-type probes each having only a basal end attached to the base plate, wherein each of the cantilever-type probes has an inclined distal end that contacts respective one of the contacted bodies and an inclined intermediate portion extending between the basal end and the distal end and being inclined with respect to the base plate and not attached to the base plate, the inclined distal end being inclined with respect to both of the basal end and the intermediate portion and sliding in a direction along a surface of the respective contacted body when contacting the respective contacted body; and
   a slide stopper arranged on the base plate restricting the slide of the inclined distal ends of the cantilever-type probes when contacting sides of the inclined distal ends of the cantilever-type probes, wherein the slide stopper has a side surface separated from the inclined distal ends of the cantilever-type probes by a predetermined distance.

15. The probe card according to claim 14, wherein the side surface of the slide stopper is surrounded by the inclined distal ends of the cantilever-type probes.

16. The probe card according to claim 14, wherein the distal ends of the probes surround the stopper.

17. A probe card used to test an electronic device, the probe card comprising:

a base plate;

a plurality of probes each having a basal end fixed to a peripheral portion of the base plate, an inclined distal end, and an intermediate portion extending between the basal end and the inclined distal end, the intermediate portion being inclined with respect to the base plate, wherein each of the inclined distal ends is inclined with respect to both of the basal end and the intermediate portion and contacts a contact of the electronic device when testing the electronic device; and a slide stopper arranged on the base plate restricting the slide of the inclined distal ends of the probes when contacting sides of the inclined distal ends.

* * * * *

UNITED STATES PATENT AND TRADEMARK OFFICE
CERTIFICATE OF CORRECTION

PATENT NO. : 7,256,591 B2 Page 1 of 1
APPLICATION NO. : 10/284085
DATED : August 14, 2007
INVENTOR(S) : Tsutomu Tatematsu et al.

It is certified that error appears in the above-identified patent and that said Letters Patent is hereby corrected as shown below:

On The Title Page, Item (54) (Title), Line 1, change "CARD," to --CARD--.

Column 1, Line 1, change "CARD," to --CARD--.

Signed and Sealed this

First Day of April, 2008

JON W. DUDAS
*Director of the United States Patent and Trademark Office*